United States Patent
Iwata

(10) Patent No.: US 9,671,212 B2
(45) Date of Patent: Jun. 6, 2017

(54) POSITION SENSOR

(71) Applicant: KABUSHIKI KAISHA TOKAI RIKA DENKI SEISAKUSHO, Aichi (JP)

(72) Inventor: Masayoshi Iwata, Aichi (JP)

(73) Assignee: KABUSHIKI KAISHA TOKAI RIKA DENKI SEISAKUSHO, Aichi (JP)

(*) Notice: Subject to any disclaimer, the term of this patent is extended or adjusted under 35 U.S.C. 154(b) by 308 days.

(21) Appl. No.: 13/940,403

(22) Filed: Jul. 12, 2013

(65) Prior Publication Data

US 2014/0020495 A1 Jan. 23, 2014

(30) Foreign Application Priority Data

Jul. 18, 2012 (JP) .................................. 2012-159833

(51) Int. Cl.
*F16H 59/04* (2006.01)
*F16H 59/10* (2006.01)
(Continued)

(52) U.S. Cl.
CPC ............. *G01B 7/14* (2013.01); *F16H 59/044* (2013.01); *F16H 59/105* (2013.01); *G01D 5/145* (2013.01);
(Continued)

(58) Field of Classification Search
CPC ............................ F16H 59/044; F16H 59/105
(Continued)

(56) References Cited

U.S. PATENT DOCUMENTS 5,243,871 A * 9/1993 Weiten ........................ 74/473.12
5,875,679 A * 3/1999 Salecker et al. ................ 74/335
(Continued)

FOREIGN PATENT DOCUMENTS

CN 201387336 1/2010
CN 101846487 9/2010
(Continued)

OTHER PUBLICATIONS

Translation of JP2008-032155, Japanese patent cited and submitted by Applicant in IDS on Feb. 9, 2016.*
(Continued)

*Primary Examiner* — William Kelleher
*Assistant Examiner* — Gregory Prather
(74) *Attorney, Agent, or Firm* — Greenblum & Bernstein, P.L.C.

(57) ABSTRACT

A position sensor that detects operation positions of an operation member includes an element array having three stages, each including one or more detection elements. A detected subject is detected by each detection element in two adjacent upstream and downstream stages to determine an operation position of the operation member. Whenever the operation member is shifted by one operation position, the detected subject is moved relative to the element array by one stage. Each detection element outputs a detection result of the detected subject. The element array includes at least three detection elements of which the detection results change whenever the operation member is shifted by one operation position. A detection element in the upstream side stage detects the detected subject before the operation position shifting, and a detection element in the downstream side stage detects the detected subject after the operation position shifting.

6 Claims, 14 Drawing Sheets

(51) Int. Cl.
*G01B 7/14* (2006.01)
*G01D 5/14* (2006.01)
*F16H 61/12* (2010.01)
*H03K 17/97* (2006.01)

(52) U.S. Cl.
CPC ...... *F16H 2061/1284* (2013.01); *H03K 17/97* (2013.01); *Y10T 74/2003* (2015.01)

(58) Field of Classification Search
USPC ........................................................ 74/473.12
See application file for complete search history.

(56) References Cited

U.S. PATENT DOCUMENTS

| | | | |
|---|---|---|---|
| 6,415,677 B1* | 7/2002 | Skogward .................. | 74/473.12 |
| 6,530,293 B1* | 3/2003 | Ruckert et al. ............. | 74/473.12 |
| 6,550,351 B1* | 4/2003 | O'Reilly et al. ................ | 74/335 |
| 6,948,582 B2* | 9/2005 | Shiomi et al. ................ | 180/315 |
| 7,669,464 B2 | 3/2010 | Dankbaar et al. | |
| 2002/0089336 A1 | 7/2002 | Jungbauer et al. | |
| 2005/0030009 A1* | 2/2005 | Moreno ................... | 324/207.11 |
| 2005/0126322 A1* | 6/2005 | Kozaki ................ | F16H 59/105 |
| | | | 74/335 |
| 2006/0283276 A1* | 12/2006 | Komatsu et al. ................ | 74/335 |
| 2007/0139038 A1 | 6/2007 | Alfors et al. | |
| 2009/0000413 A1* | 1/2009 | Furhoff et al. ................ | 74/473.3 |
| 2009/0115558 A1* | 5/2009 | Easton ........................... | 335/207 |
| 2010/0175494 A1* | 7/2010 | Schober et al. ........... | 74/473.12 |
| 2010/0207614 A1* | 8/2010 | Kammer et al. ......... | 324/207.25 |
| 2011/0202242 A1* | 8/2011 | Habenschaden ................ | 701/51 |
| 2011/0296942 A1* | 12/2011 | Wu ....................... | F16H 59/105 |
| | | | 74/473.12 |
| 2014/0232039 A1* | 8/2014 | Minematsu et al. ..... | 264/272.19 |
| 2014/0236435 A1* | 8/2014 | Habenschaden ................ | 701/51 |

FOREIGN PATENT DOCUMENTS

| | | |
|---|---|---|
| DE | 10038433 | 2/2002 |
| DE | 102008004916 | 7/2009 |
| JP | 2008-32155 | 2/2008 |
| JP | 2008-309303 | 12/2008 |
| WO | 01/13011 | 2/2001 |

OTHER PUBLICATIONS

Office Action issued in Japan Counterpart Patent Appl. No. 2012-159833, dated Jan. 19, 2016 , along with an English translation thereof.

\* cited by examiner

Fig.7
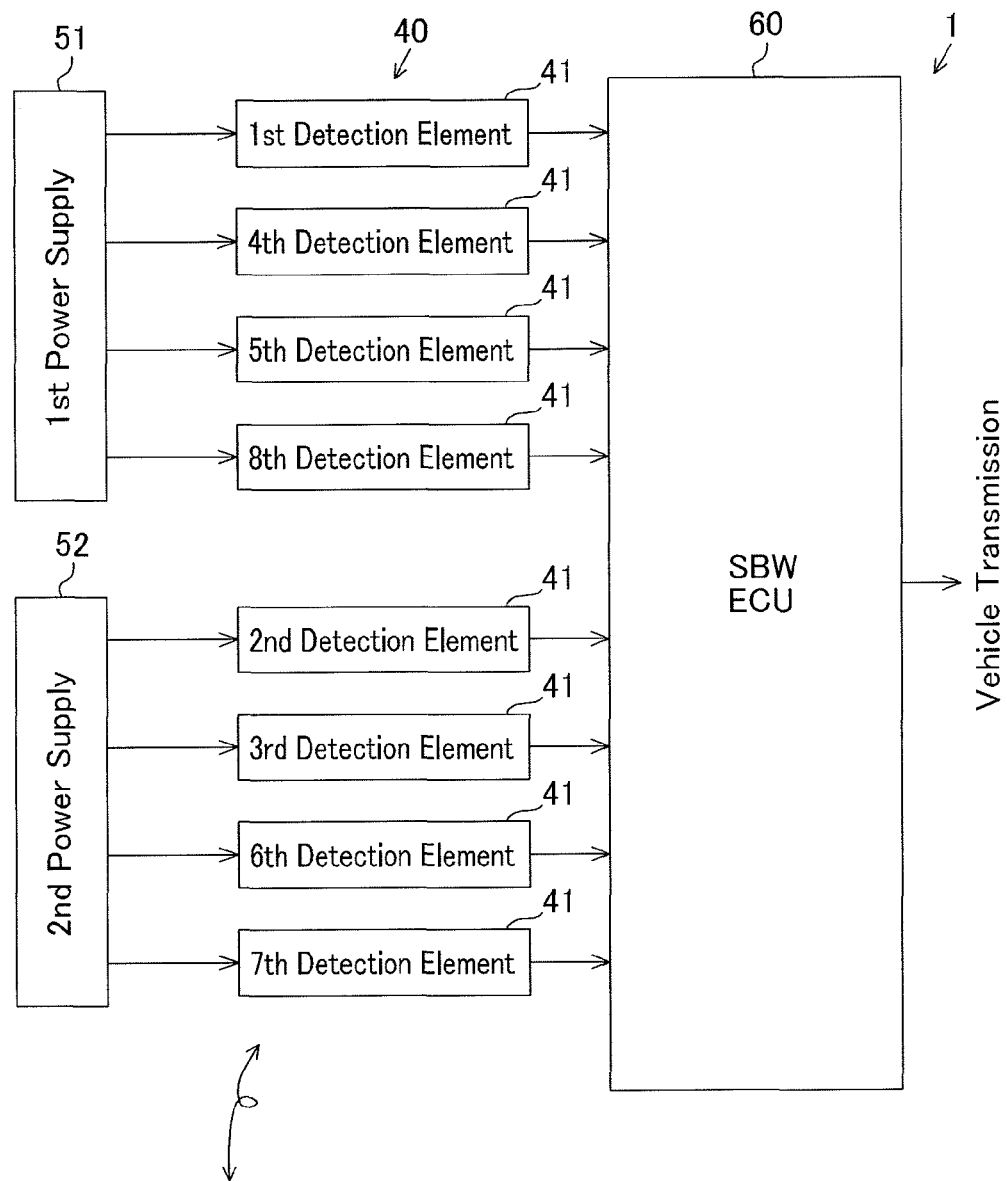
Power Supply Grouping of Elements
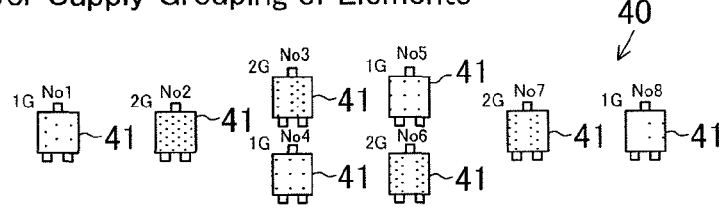

|   | No1 | No2 | No3 | No4 | No5 | No6 | No7 | No8 | ON Position | Determination |
|---|-----|-----|-----|-----|-----|-----|-----|-----|-------------|---------------|
| P | ON  | ON  | OFF | OFF | OFF | OFF | OFF | OFF | 12          | OP            |
| R | OFF | ON  | ON  | ON  | OFF | OFF | OFF | OFF | 234         | OR            |
| N | OFF | OFF | ON  | ON  | ON  | ON  | OFF | OFF | 3456        | ON            |
| D | OFF | OFF | OFF | OFF | ON  | ON  | ON  | OFF | 567         | OD            |
| S | OFF | OFF | OFF | OFF | OFF | OFF | ON  | ON  | 78          | OS            |

Fig.9

P Position

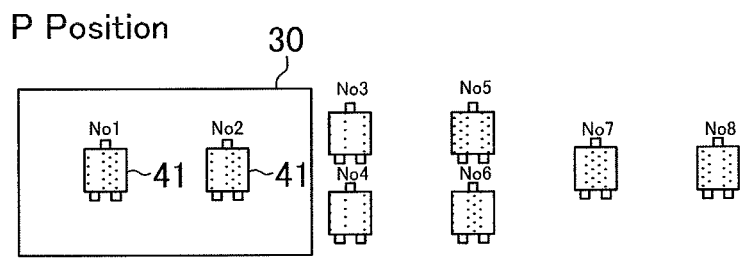

|  | No1 | No2 | No3 | No4 | No5 | No6 | No7 | No8 | ON Position | Determination |
|---|---|---|---|---|---|---|---|---|---|---|
| P | ON | ON | OFF | OFF | OFF | OFF | OFF | OFF | 12 | OP |
| Single Failure (P) | OFF | ON | OFF | OFF | OFF | OFF | OFF | OFF | 2 | △FP |
| | ON | OFF | OFF | OFF | OFF | OFF | OFF | OFF | 1 | △FP |
| | ON | ON | ON | OFF | OFF | OFF | OFF | OFF | 123 | △FP |
| | ON | ON | OFF | ON | OFF | OFF | OFF | OFF | 124 | △FP |
| | ON | ON | OFF | OFF | ON | OFF | OFF | OFF | 125 | △FP |
| | ON | ON | OFF | OFF | OFF | ON | OFF | OFF | 126 | △FP |
| | ON | ON | OFF | OFF | OFF | OFF | ON | OFF | 127 | △FP |
| | ON | ON | OFF | OFF | OFF | OFF | OFF | ON | 128 | △FP |
| | OFF | ON | OFF | OFF | OFF | OFF | OFF | OFF | 2 | △FP |
| | ON | OFF | OFF | OFF | OFF | OFF | OFF | OFF | 1 | △FP |

Fig.10

R Position

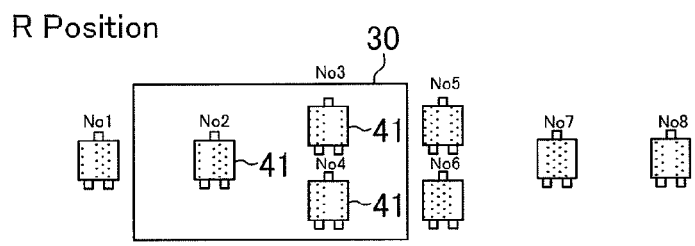

| | No1 | No2 | No3 | No4 | No5 | No6 | No7 | No8 | ON Position | Determination |
|---|---|---|---|---|---|---|---|---|---|---|
| R | OFF | ON | ON | ON | OFF | OFF | OFF | OFF | 234 | ○R |
| Single Failure (R) | ON | ON | ON | ON | OFF | OFF | OFF | OFF | 1234 | △FR |
| | OFF | OFF | ON | ON | OFF | OFF | OFF | OFF | 34 | △FR |
| | OFF | ON | OFF | ON | OFF | OFF | OFF | OFF | 24 | △FR |
| | OFF | ON | ON | OFF | OFF | OFF | OFF | OFF | 23 | △FR |
| | OFF | ON | ON | ON | ON | OFF | OFF | OFF | 2345 | △FR |
| | OFF | ON | ON | ON | OFF | ON | OFF | OFF | 2346 | △FR |
| | OFF | ON | ON | ON | OFF | OFF | ON | OFF | 2347 | △FR |
| | OFF | ON | ON | ON | OFF | OFF | OFF | ON | 2348 | △FR |
| | OFF | ON | ON | OFF | OFF | OFF | OFF | OFF | 23 | △FR |
| | OFF | OFF | OFF | ON | OFF | OFF | OFF | OFF | 4 | △FR |

Fig.11

N Position

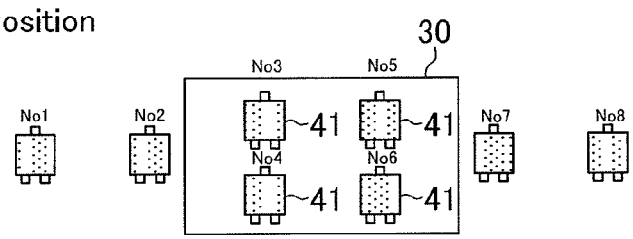

| | No1 | No2 | No3 | No4 | No5 | No6 | No7 | No8 | ON Position | Determination |
|---|---|---|---|---|---|---|---|---|---|---|
| N | OFF | OFF | ON | ON | ON | ON | OFF | OFF | 3456 | ON |
| Single Failure (N) | ON | OFF | ON | ON | ON | ON | OFF | OFF | 13456 | △FN |
| | OFF | ON | ON | ON | ON | ON | OFF | OFF | 23456 | △FN |
| | OFF | OFF | OFF | ON | ON | ON | OFF | OFF | 456 | △FN |
| | OFF | OFF | ON | OFF | ON | ON | OFF | OFF | 356 | △FN |
| | OFF | OFF | ON | ON | OFF | ON | OFF | OFF | 346 | △FN |
| | OFF | OFF | ON | ON | ON | OFF | OFF | OFF | 345 | △FN |
| | OFF | OFF | ON | ON | ON | ON | ON | OFF | 34567 | △FN |
| | OFF | OFF | ON | ON | ON | ON | OFF | ON | 34568 | △FN |
| | OFF | OFF | ON | OFF | OFF | ON | OFF | OFF | 36 | △FN |
| | OFF | OFF | OFF | ON | ON | OFF | OFF | OFF | 45 | △FN |

Fig.12

D Position

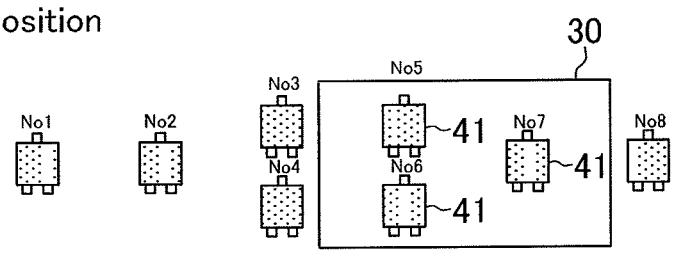

| | No1 | No2 | No3 | No4 | No5 | No6 | No7 | No8 | ON Position | Determination |
|---|---|---|---|---|---|---|---|---|---|---|
| D | OFF | OFF | OFF | OFF | ON | ON | ON | OFF | 567 | ○D |
| Single Failure (D) | ON | OFF | OFF | OFF | ON | ON | ON | OFF | 1567 | △FD |
| | OFF | ON | OFF | OFF | ON | ON | ON | OFF | 2567 | △FD |
| | OFF | OFF | ON | OFF | ON | ON | ON | OFF | 3567 | △FD |
| | OFF | OFF | OFF | ON | ON | ON | ON | OFF | 4567 | △FD |
| | OFF | OFF | OFF | OFF | OFF | ON | ON | OFF | 67 | △FD |
| | OFF | OFF | OFF | OFF | ON | OFF | ON | OFF | 57 | △FD |
| | OFF | OFF | OFF | OFF | ON | ON | OFF | OFF | 56 | △FD |
| | OFF | OFF | OFF | OFF | ON | ON | ON | ON | 5678 | △FD |
| | OFF | OFF | OFF | OFF | OFF | ON | ON | OFF | 67 | △FD |
| | OFF | OFF | OFF | OFF | ON | OFF | OFF | OFF | 5 | △FD |

Fig.13

S Position

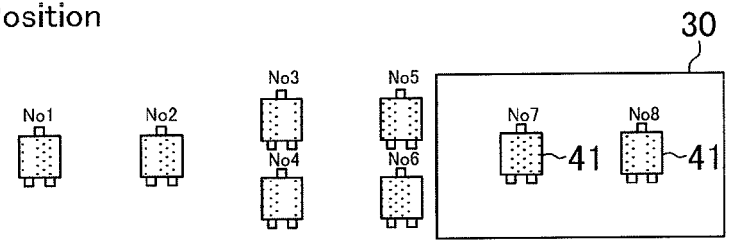

| | No1 | No2 | No3 | No4 | No5 | No6 | No7 | No8 | ON Position | Determination |
|---|---|---|---|---|---|---|---|---|---|---|
| S | OFF | OFF | OFF | OFF | OFF | OFF | ON | ON | 78 | ○S |
| Single Failure (S) | ON | OFF | OFF | OFF | OFF | OFF | ON | ON | 178 | △FS |
| | OFF | ON | OFF | OFF | OFF | OFF | ON | ON | 278 | △FS |
| | OFF | OFF | ON | OFF | OFF | OFF | ON | ON | 378 | △FS |
| | OFF | OFF | OFF | ON | OFF | OFF | ON | ON | 478 | △FS |
| | OFF | OFF | OFF | OFF | ON | OFF | ON | ON | 578 | △FS |
| | OFF | OFF | OFF | OFF | OFF | ON | ON | ON | 678 | △FS |
| | OFF | OFF | OFF | OFF | OFF | OFF | OFF | ON | 8 | △FS |
| | OFF | OFF | OFF | OFF | OFF | OFF | ON | OFF | 7 | △FS |
| | OFF | OFF | OFF | OFF | OFF | OFF | ON | OFF | 7 | △FS |
| | OFF | OFF | OFF | OFF | OFF | OFF | OFF | ON | 8 | △FS |

Fig.15
1st Position
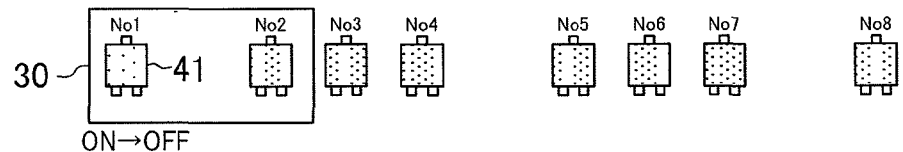
Change in 3 elements at adjacent position
2nd Position
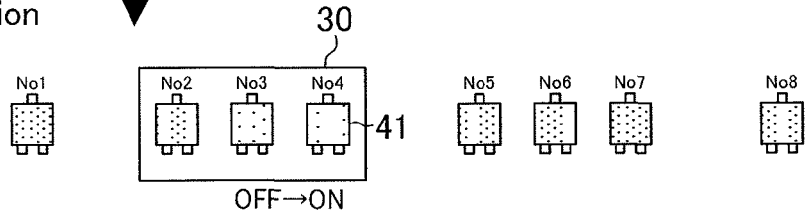
Fig.16
2nd Position
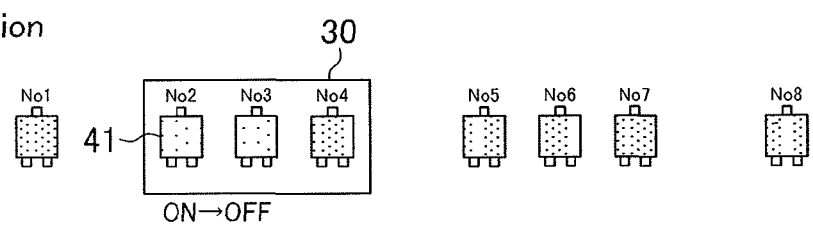
Change in 3 elements at adjacent position
3rd Position
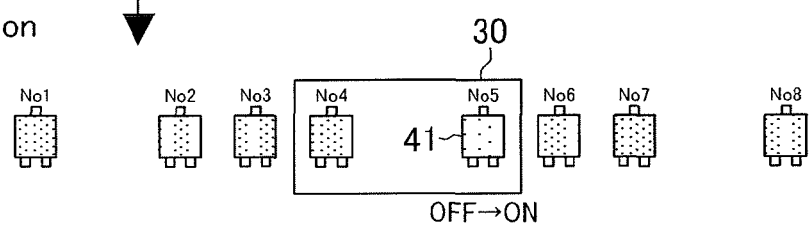

POSITION SENSOR

CROSS-REFERENCE TO RELATED APPLICATIONS

This application is based upon and claims the benefit of priority from prior Japanese Patent Application No. 2012-159833, filed on Jul. 18, 2012, the entire contents of which are incorporated herein by reference.

FIELD

The present invention relates to a position sensor that detects an operation position of an operation member.

BACKGROUND

A shift-by-wire type gearshift device includes an operation member that is mechanically separated from a transmission. Such type of a gearshift device includes a position sensor that detects an operation position of an operation member. The gearshift device electrically processes the detection signal of the position sensor to shift transmission modes.

Japanese Laid-Open Patent Publication No. 2008-309303 describes a position sensor that includes a magnet and detection elements. The publication describes a failsafe technique that allows for detection of the position of a shift lever even when one of the detection elements fails to function. The publication also describes the use of a timer to distinguish failure of a detection element from normal transition conditions of each detection element.

However, a failsafe may result in a complicated magnetization process. This increases the cost and size of of the magnet.

SUMMARY

One aspect of the present invention provides a position sensor that detects operation positions of an operation member. The position sensor is provided with an element array including at least three stages. Each stage includes one or more detection elements. A detected subject is simultaneously detected by each of the detection elements in two adjacent stages of the element array that are an upstream side stage and a downstream side stage to determine one operation position of the operation member. Whenever the operation member is shifted by one operation position, the detected subject is moved relative to the element array toward the downstream side by one stage. Each of the detection elements of the element array outputs a detection result indicating the presence or absence of the detected subject. The element array includes at least three detection elements of which the detection results change whenever the operation member is shifted by one operation position. The at least three detection elements include at least one detection element in the upstream side stage that detects the detected subject before the operation member is shifted by one operation position and at least one detection element in the downstream side stage that detects the detected subject after the operation member is shifted by one operation position.

A further aspect of the present invention is a position sensor that detects operation positions of an operation member. The position sensor includes an element array including at least five stages. Each stage includes one detection element or includes no detection elements. A detected subject is simultaneously detected by each of the detection elements in three consecutive stages of the element array that are an upstream side stage, a middle stage, and a downstream side stage to determine one operation position of the operation member. Whenever the operation member is shifted by one operation position, the detected subject is moved relative to the element array toward the downstream side by two stages. Each of the detection elements of the element array outputs a detection result indicating the presence or absence of the detected subject. The element array includes at least three detection elements of which the detection results change whenever the operation member is shifted by one operation position. The at least three detection elements includes at least one detection element in the upstream side stage or the middle stage that detects the detected subject before the operation member is shifted by one operation position and at least one detection element in the middle stage or the downstream side stage that detects the detected subject after the operation member is shifted by one operation position.

BRIEF DESCRIPTION OF THE DRAWINGS

FIG. 7 is a schematic block diagram illustrating the electric configuration of the gearshift device and a schematic plan view illustrating the power supply grouping of detection elements;

FIG. 9 is an example of a table used to determine the P position;

FIG. 10 is an example of a table used to determine the R position;

FIG. 11 is an example of a table used to determine the N position;

FIG. 12 is an example of a table used to determine the D position;

FIG. 13 is an example of a table used to determine the S position;

FIG. 15 is a schematic plan view illustrating movement of the shift lever from the first position to the second position;

FIG. 16 is a schematic plan view illustrating movement of the shift lever from the second position to the third position;

DESCRIPTION OF THE EMBODIMENTS

One embodiment of a position sensor will now be described. The position sensor is applied to a gearshift device that shifts modes of a transmission. The position sensor detects the operation position of an operation member in the gearshift device.

Figure 1:
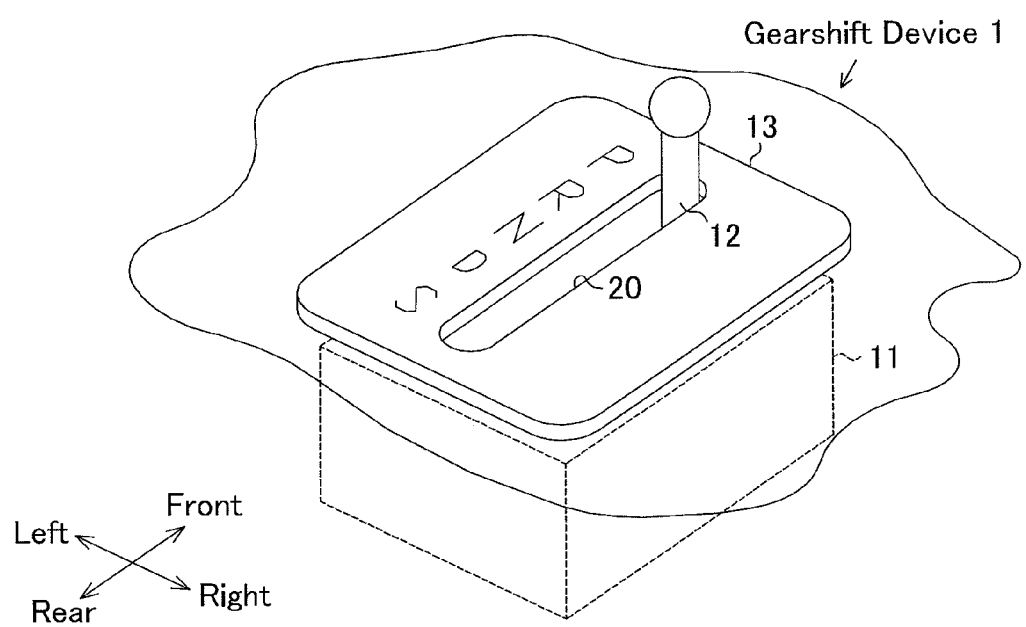
FIG. 1 is a schematic perspective view illustrating a gearshift device including a position sensor.

Referring to FIG. 1, a gearshift device 1 includes a device body 11, a shift lever 12, and a shift panel 13. The device body 11 is arranged on the vehicle body. The shift lever 12 serves as an operation member supported by the device body 11. Further, the shift lever 12 extends through the shift panel 13. The shift panel 13 includes a shift gate 20 that guides the operation of the shift lever 12. The shift gate 20 extends in the front to rear direction of the vehicle. Operation positions of the shift lever 12, namely, a P position, an R position, an N position, a D position, and an S position are set along the shift gate 20 from the front side to the rear side. The P position designates a parking (P) mode, and the R position designates a reverse (R) mode of the transmission. The N position designates a neutral (N) mode of the transmission, and the D position designates a drive (D) mode of the transmission. The S position designates a sequential (S) mode of the transmission.

Figure 2:
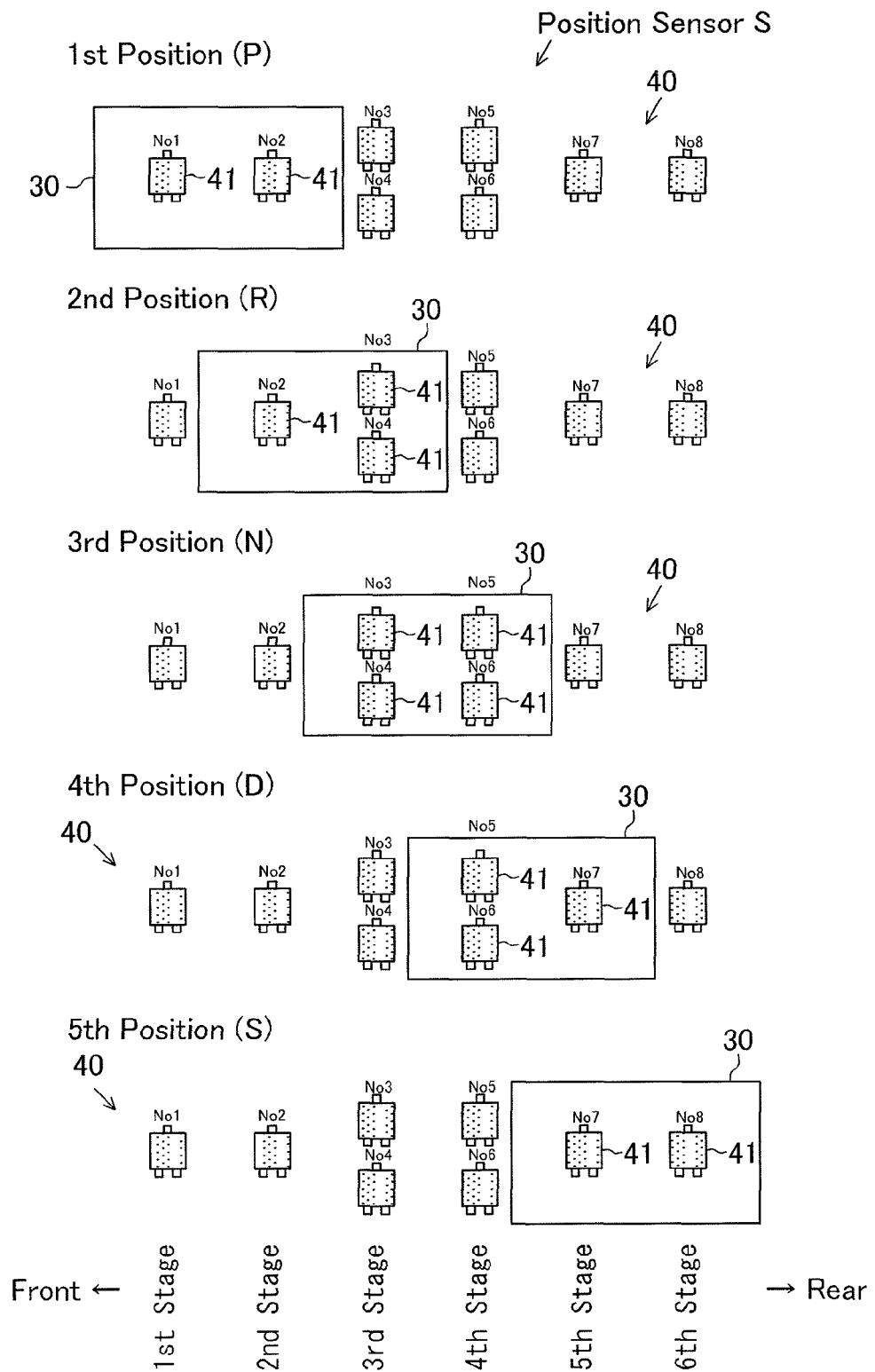
FIG. 2 is a schematic plan view illustrating the position sensor of FIG. 1.

Referring to FIG. 2, the gearshift device 1 includes a position sensor S that detects operation positions of the shift lever 12. The position sensor S includes detection elements 41 and a detected subject detected by the detection elements 41. The detected subject is, for example, a magnet 30. In the present embodiment, the magnet 30 is a movable element, and the detection elements 41 are fixed elements. The magnet 30 is arranged on the shift lever 12. Accordingly, the magnet 30 moves in cooperation with the movement of the shift lever 12. The detection elements 41 are arranged on a substrate coupled to the device body 11. The position sensor S will now be described in detail.

As illustrated in FIG. 2, the position sensor S includes a magnet 30 and an element array 40 having at least three stages (or columns) and arranged facing a magnet 30. In the present embodiment, the element array 40 includes six stages, with each stage including one or more detection elements 41. The magnet 30 has, for example, the form of a block. The six stages of the element array 40 are arranged from the front side (upstream side) toward the rear side (downstream side) of the vehicle. The frontmost stage of the element array 40 is referred to as the first stage, and the following stages are referred to as the second to sixth stages in order toward the rear. The first stage has a single detection element 41, namely, the first detection element 41 (No. 1). The second stage has a single detection element 41, namely, the second detection element 41 (No. 2). The third stage has two detection elements 41, namely, the third detection element 41 (No. 3) and the fourth detection element 41 (No. 4). The fourth stage has two detection elements 41, namely, the fifth detection element 41 (No. 5) and the sixth detection element 41 (No. 6). The fifth stage has a single detection element 41, namely, the seventh detection element 41 (No. 7). The sixth stage has a single detection element 41, namely, the eighth detection element 41 (No. 8).

The magnet 30 has a size allowing for simultaneous detection by each of the detection elements 41 in two adjacent stages. For example, when the shift lever 12 is located at a first position (P position in the present example), the magnet 30 is simultaneously detected by the first detection element 41 of the first stage and the second detection element 41 of the second stage. When the shift lever 12 is located at a second position (R position in the present example), the magnet 30 is simultaneously detected by the second detection element 41 of the second stage and the third and fourth detection elements 41 of the third stage. When the shift lever 12 is located at a third position (N position in the present example), the magnet 30 is simultaneously detected by the third and fourth detection elements 41 of the third stage and the fifth and sixth detection elements 41 of the fourth stage. When the shift lever 12 is located at a fourth position (D position in the present example), the magnet 30 is simultaneously detected by the fifth and sixth detection elements 41 of the fourth stage and the seventh detection element 41 of the fifth stage. When the shift lever 12 is located at a fifth position (S position in the present example), the magnet 30 is simultaneously detected by the seventh detection element 41 of the fifth stage and the eighth detection element 41 of the sixth stage.

In this manner, the magnet 30 is moved relative to the element array 40 by one stage whenever the shift lever 12 is shifted by one operation position. Each of the detection elements 41 outputs a detection result indicating whether or not the magnet 30 is detected, that is, the presence or absence of the magnet 30.

Figure 3:
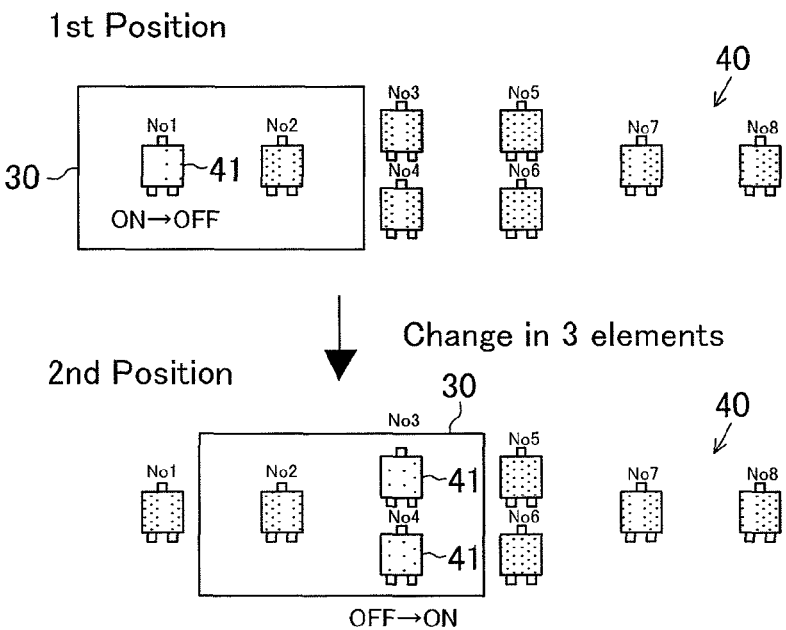
FIG. 3 is a schematic plan view illustrating movement of a shift lever from a first position to a second position.

Referring to FIG. 3, when the shift lever 12 is shifted from the first position to the second position, the detection result of the first detection element 41 is switched from ON to OFF to indicate that the magnet 30 is not detected. Further, the detection results of the third and fourth detection elements 41 are switched from OFF to ON to indicate that the magnet 30 is detected. In the present specification, each detection element 41 outputs a detection result ON when detecting the magnet 30, and outputs a detection result OFF when not detecting the magnet 30. That is, the detection result ON indicates the presence of the magnet 30, and the detection result OFF indicates the absence of the magnet 30.

Figure 4:
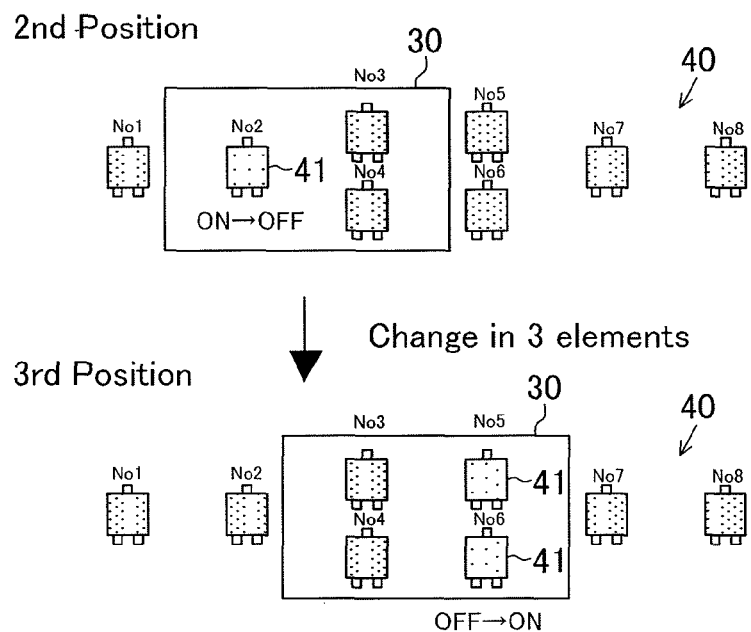
FIG. 4 is a schematic plan view illustrating movement of the shift lever from the second position to a third position.

Referring to FIG. 4, when the shift lever 12 is shifted from the second position to the third position, the detection result of the second detection element 41 is switched from ON to OFF. Further, the detection results of the fifth and sixth detection elements 41 are switched from OFF to ON.

Figure 5:
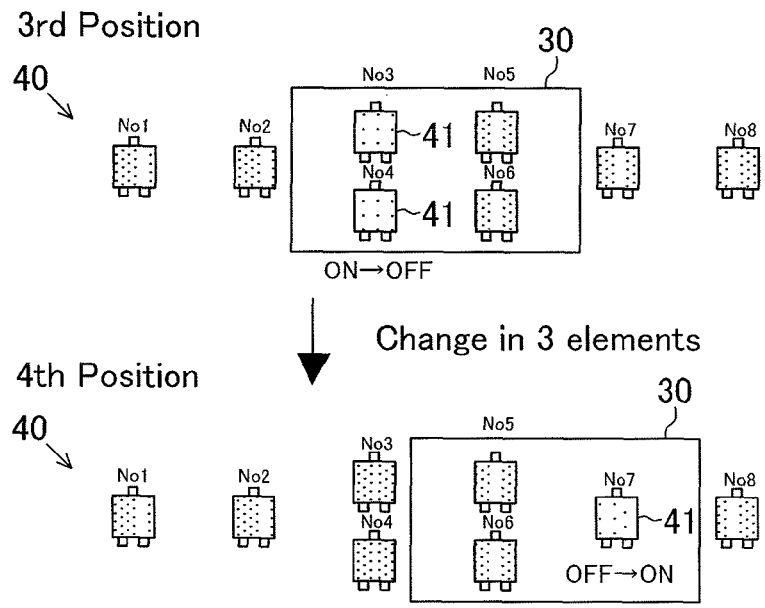
FIG. 5 is a schematic plan view illustrating movement of the shift lever from the third position to a fourth position.

Referring to FIG. 5, when the shift lever 12 is shifted from the third position to the fourth position, the detection results of the third and fourth detection elements 41 are switched from ON to OFF. Further, the detection result of the seventh detection element 41 is switched from OFF to ON.

Figure 6:
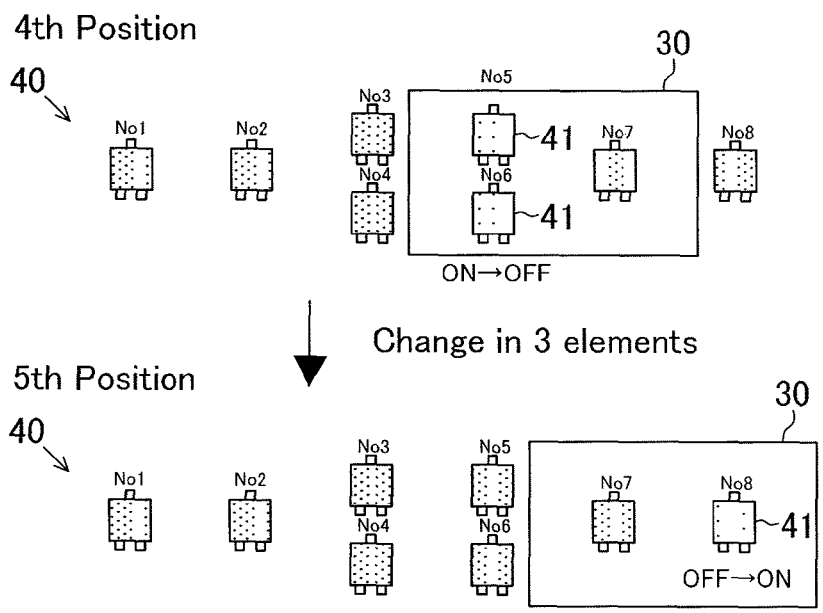
FIG. 6 is a schematic plan view illustrating movement of the shift lever from the fourth position to a fifth position.

Referring to FIG. 6, when the shift lever 12 is shifted from the fourth position to the fifth position, the detection results of the fifth and sixth detection elements 41 are switched from ON to OFF. Further, the detection result of the eighth detection element 41 is switched from OFF to ON.

In this manner, the element array 40 includes at least three (three in the present example) detection elements 41 of which detection results (ON/OFF) change whenever the shift lever 12 is shifted by one operation position. The at least three detection elements 41 includes at least one detection element 41 in an upstream side stage that detects the magnet 30 before the operation position of the shift lever 12 is shifted and at least one detection element 41 in a downstream side stage that detects the magnet 30 after the operation position of the shift lever 12 is shifted.

Referring to FIG. 7, in the element array 40, the first, fourth, fifth, and eighth detection elements 41 belong to a first group (1G) that uses a first power supply 51 to function. The second, third, sixth, and seventh detection elements 41 belong to a second group (2G) that uses a second power supply 52 to function. When grouping the detection elements 41 in accordance with the corresponding power supply, the detection elements 41 of two adjacent stages are divided into two groups that use different power supplies. In other words, one of two adjacent stages includes a detection element 41 belonging to the first group, and the other one of the two adjacent stages includes a detection element 41 belonging to the second group.

A shift-by-wire electronic control unit (SBW ECU) 60 combines detection signals (detection results) of the eight detection elements 41 in the element array 40 to determine the operation position of the shift lever 12. Here, each of the detection elements 41 outputs an ON signal, which indicates the presence of the magnet 30, or an OFF signal, which indicates the absence of the magnet 30, as the detection signal. The SBW ECU 60 then shifts the mode of the transmission in accordance with the determination result of the operation position.

The operation of the gearshift device 1 will now be described.

Figure 8:
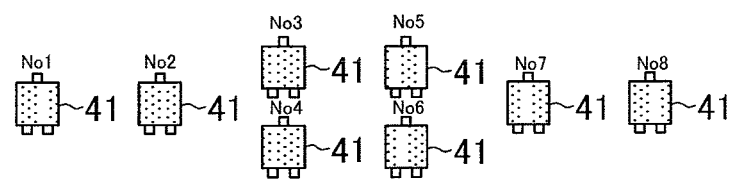
FIG. 8 is an example of a table used to determine operation positions.

Referring to the first line in the table of FIG. 8, when the shift lever 12 is located at the P position and the first to eighth detection elements 41 are all functioning normally, the first and second detection elements 41 each output an ON signal, and the remaining detection elements 41 each output an OFF signal. The first and second detection elements 41 are associated with the P position. Accordingly, based on the ON signals from the first and second detection elements 41, the ECU 60 determines that the shift lever 12 is located at the P position.

Referring to the second line in the table of FIG. 8, when the shift lever 12 is located at the R position and the detection elements 41 are all functioning normally, the second, third, and fourth detection elements 41 each output an ON signal, and the remaining detection elements 41 each output an OFF signal. The second, third, and fourth detection elements 41 are associated with the R position. Accordingly, based on the ON signals from the second, third, and fourth detection elements 41, the ECU 60 determines that the shift lever 12 is located at the R position.

Referring to the third line in the table of FIG. 8, when the shift lever 12 is located at the N position and the detection elements 41 are all functioning normally, the third, fourth, fifth, and sixth detection elements 41 each output an ON signal, and the remaining detection elements 41 each output an OFF signal. The third, fourth, fifth, and sixth detection elements 41 are associated with the N position. Accordingly, based on the ON signals from the third, fourth, fifth, and sixth detection elements 41, the ECU 60 determines that the shift lever 12 is located at the N position.

Referring to the fourth line in the table of FIG. 8, when the shift lever 12 is located at the D position and the detection elements 41 are all functioning normally, the fifth, sixth, and seventh detection elements 41 each output an ON signal, and the remaining detection elements 41 each output an OFF signal. The fifth, sixth, and seventh elements 41 are associated with the D position. Accordingly, based on the ON signals from the fifth, sixth, and seventh detection elements 41, the ECU 60 determines that the shift lever 12 is located at the D position.

Referring to the fifth line in the table of FIG. 8, when the shift lever 12 is located at the S position and the detection elements 41 are all functioning normally, the seventh and eighth detection elements 41 each output an ON signal, and the remaining detection elements 41 each output an OFF signal. The seventh and eighth detection elements 41 are associated with the S position. Accordingly, based on the ON signals from the seventh and eighth detection elements 41, the ECU 60 determines that the shift lever 12 is located at the S position.

In this manner, when the detection elements 41 are all functioning normally, the combination of the detection elements 41 that output ON signals differs between operation positions. Thus, the operation position is determined directly from the combination of the detection elements 41 that output ON signals.

Referring to the first line in the table of FIG. 9, when the shift lever 12 is located at the P position and the detection elements 41 are all functioning normally, the first and second detection elements 41 each output an ON signal. In contrast, referring to the second line in the table of FIG. 9, when the first detection element 41 should output an ON signal but outputs an OFF signal due to a failure, only the second detection element 41 outputs an ON signal. Further, referring to the third line in the table of FIG. 9, when a failure solely occurs in the second detection element 41, only the first detection element 41 outputs an ON signal. In the same manner, the fourth to ninth lines in the table of FIG. 9 illustrate the combination of the detection elements 41 that output ON signals when a failure solely occurs in each of the third to eighth detection elements 41.

The second line from the bottom in the table of FIG. 9 illustrates a case in which a failure solely occurs in the first power supply 51 that supplies power to the first, fourth, fifth, and eighth detection elements 41. In this case, each of the first, fourth, fifth, and eighth detection elements 41 does not function and thereby outputs an OFF signal. Thus, only the second detection element 41 outputs an ON signal. The bottom line in the table of FIG. 9 illustrates a case in which a failure solely occurs in the second power supply 52 that supplies power to the second, third, sixth, and seventh detection elements 41. In this case, each of the second, third, sixth, and seventh detection elements 41 does not function and thereby outputs an OFF signal. Thus, only the first detection element 41 outputs an ON signal.

Referring to the first line in the table of FIG. 10, when the shift lever 12 is located at the R position and the detection elements 41 are all functioning normally, the second, third, and fourth detection elements 41 each output an ON signal. In contrast, referring to the second line in the table of FIG. 10, when the first detection element 41 should output an OFF signal but outputs an ON signal due to a failure, the first, second, third, and fourth detection elements 41 each output an ON signal. Further, referring to the third line in the table of FIG. 10, when a failure solely occurs in the second detection element 41, the third and fourth detection elements 41 each output an ON signal. In the same manner, the fourth to ninth lines in the table of FIG. 10 illustrate the combination of the detection elements 41 that output ON signals when a failure solely occurs in each of the third to eighth detection elements 41.

The second line from the bottom in the table of FIG. 10 illustrates a case in which a failure solely occurs in the first power supply 51 that supplies power to the first, fourth, fifth, and eighth detection elements 41. In this case, each of the first, fourth, fifth, and eighth detection elements 41 does not function and thereby outputs an OFF signal. Thus, the second and third detection elements 41 each output an ON signal. The bottom line in the table of FIG. 10 illustrates a case in which a failure solely occurs in the second power supply 52 that supplies power to the second, third, sixth, and seventh detection elements 41. In this case, each of the second, third, sixth, and seventh detection elements 41 does not function and thereby outputs an OFF signal. Thus, only the fourth detection element 41 outputs an ON signal.

Referring to the first line in the table of FIG. 11, when the shift lever 12 is located at the N position and the detection elements 41 are all functioning normally, the third, fourth, fifth, and sixth detection elements 41 each output an ON signal. In contrast, referring to the second line in the table of FIG. 11, when the first detection element 41 should output an OFF signal but outputs an ON signal due to a failure, the first, third, fourth, fifth, and sixth detection element 41 each output an ON signal. Further, referring to the third line in the table of FIG. 11, when a failure solely occurs in the second detection element 41, the second, third, fourth, fifth, and sixth detection elements 41 each output an ON signal. In the same manner, the fourth to ninth lines in the table of FIG. 11 illustrate the combination of the detection elements 41 that output ON signals when a failure solely occurs in each of the third to eighth detection elements 41.

The second line from the bottom in the table of FIG. 11 illustrates a case in which a failure solely occurs in the first power supply 51 that supplies power to the first, fourth, fifth, and eighth detection elements 41. In this case, each of the first, fourth, fifth, and eighth detection elements 41 does not function and thereby outputs an OFF signal. Thus, the third and sixth detection elements 41 each output an ON signal. The bottom line in the table of FIG. 11 illustrates a case in which a failure solely occurs in the second power supply 52 that supplies power to the second, third, sixth, and seventh detection elements 41. In this case, each of the second, third, sixth, and seventh detection elements 41 does not function and thereby outputs an OFF signal. Thus, the fourth and fifth detection elements 41 each output an ON signal.

Referring to the first line in the table of FIG. 12, when the shift lever 12 is located at the D position and the detection elements 41 are all functioning normally, the fifth, sixth, and seventh detection elements 41 each output an ON signal. In contrast, referring to the second line in the table of FIG. 12, when the first detection element 41 should output an OFF signal but outputs an ON signal due to a failure, the first, fifth, sixth, and seventh detection elements 41 each output an ON signal. Further, referring to the third line in the table of FIG. 12, when a failure solely occurs in the second detection element 41, the second, fifth, sixth, and seventh detection elements 41 each output an ON signal. In the same manner, the fourth to ninth lines in the table of FIG. 12 illustrate the combination of the detection elements 41 that output ON signals when a failure solely occurs in each of the third to eighth detection elements 41.

The second line from the bottom in the table of FIG. 12 illustrates a case in which a failure solely occurs in the first power supply 51 that supplies power to the first, fourth, fifth, and eighth detection elements 41. In this case, each of the first, fourth, fifth, and eighth detection elements 41 does not function and thereby outputs an OFF signal. Thus, the sixth and seventh detection elements 41 each output an ON signal. The bottom line in the table of FIG. 12 illustrates a case in which a failure solely occurs in the second power supply 52 that supplies power to the second, third, sixth, and seventh detection elements 41. In this case, each of the second, third, sixth, and seventh detection elements 41 does not function and thereby outputs an OFF signal. Thus, only the fifth detection element 41 outputs an ON signal.

Referring to the first line in the table of FIG. 13, when the shift lever 12 is located at the S position and the detection elements 41 are all functioning normally, the seventh and eighth detection elements 41 each output an ON signal. In contrast, referring to the second line in the table of FIG. 13, when the first detection element 41 should output an OFF signal but outputs an ON signal due to a failure, the first, seventh and eighth detection elements 41 each output an ON signal. Further, referring to the third line in the table of FIG. 13, when a failure solely occurs in the second detection element 41, the second, seventh and eighth detection elements 41 each output an ON signal. In the same manner, the fourth to ninth lines in the table of FIG. 13 illustrate the combination of the detection elements 41 that output ON signals when a failure solely occurs in each of the third to eighth detection elements 41.

The second line from the bottom in the table of FIG. 13 illustrates a case in which a failure solely occurs in the first power supply 51 that supplies power to the first, fourth, fifth, and eighth detection elements 41. In this case, each of the first, fourth, fifth, and eighth detection elements 41 does not function and thereby outputs an OFF signal. Thus, only the seventh detection element 41 outputs an ON signal. The bottom line in the table of FIG. 13 illustrates a case in which a failure solely occurs in the second power supply 52 that supplies power to the second, third, sixth, and seventh detection elements 41. In this case, each of the second, third, sixth, and seventh detection elements 41 does not function and thereby outputs an OFF signal. Thus, only the eighth detection element 41 outputs an ON signal.

In this manner, when a failure solely occurs in only one of the detection elements 41, the number of detection elements 41 that output an ON signal is increased or decreased by only one with respect to the proper combination. In such a case, however, the combination of the detection elements 41 that output an ON signal differs between each operation position. Thus, a failsafe functions and allows for determination of the operation position. Further, when a failure solely occurs in one of the power supplies, the number of detection elements 41 that output an ON signal is increased or decreased with respect to the proper combination. In such a case, however, the combination of the detection elements 41 that output an ON signal differs between each operation position. Thus, a failsafe functions and allows for determination of the operation position.

For example, referring to the first line in the table of FIG. 9, when the position sensor S detects the P position, the proper combination of the detection elements 41 is the combination of the first and second detection elements 41. However, when a failure solely occurs in the first detection element 41, as illustrated by the second line in the table of FIG. 9, the number of detection elements 41 outputting the ON signal is decreased by one, and only the second detection element 41 outputs an ON signal. As illustrated in FIGS. 9 to 13, cases in which only the second detection element 41 output an ON signal includes the case illustrated by the second line in the table of FIG. 9 and the case illustrated by the second line from the bottom in FIG. 9. Accordingly, even if a failure solely occurs in a detection element 41 or a power supply, when the second detection element 41 outputs an ON signal, the failsafe function allows for the ECU 60 to determine that the shift lever 12 is located at the P position. In this case, a notification device (not illustrated) indicates the occurrence of a failure in a sole detection element 41 or power supply.

The present embodiment has the advantages described below.

(1) As illustrated in FIG. 8, the combination of the detection elements that output an ON signal differs for each operation position. This allows for determination of an operation position in association with each combination.

(2) As illustrated in the second to ninth lines in FIGS. 9 to 13, when a failure occurs in a single detection element 41, the number of detection elements 41 that output an ON signal is increased or decreased by one with respect to the proper combination. However, even in such a case, the combination of the detection elements 41 that output an ON signal differs between operation positions. Thus, the failsafe function allows for determination of the operation position.

(3) The magnet 30 has a size allowing for simultaneous detection by each of the detection elements 41 in two adjacent stages. Thus, there is no need for a complicated structure to realize the failsafe function. The failsafe function may be realized using just one simple magnet 30.

(4) As illustrated in the second line from the bottom and the bottom line in FIGS. 9 to 13, when a failure occurs in the first power supply 51 or the second power supply 52, the number of the detection elements 41 that output an ON signal is increased or decreased with respect to the proper combination. In such a case, however, the combination of the detection elements 41 that output an ON signal differs between operation positions. Thus, even when one power supply fails to function, the failsafe function allows for determination of the operation position.

It should be apparent to those skilled in the art that the present invention may be embodied in many other specific forms without departing from the spirit or scope of the invention. Particularly, it should be understood that the present invention may be embodied in the following forms.

The element array 40 may include, for example, nine stages, and the number of the detection elements 41 in the nine stages may be 1, 2, 2, 1, 1, 2, 2, 1, and 1. Like the above embodiment, in this case, whenever the shift lever 12 is shifted by one operation position, the magnet 30 is moved relative to the element array 40 by one stage, and the detection elements 41 in two adjacent stages all simultaneously detect the magnet 30. Further, whenever the shift lever 12 is shifted by one operation position, the detection results (ON/OFF) change in at least three detection elements 41. The at least three detection elements 41 includes at least one detection element 41 in an upstream side stage that detects the magnet 30 before the operation position of the shift lever 12 is shifted and at least one detection element 41 in a downstream side stage that detects the magnet 30 after the operation position of the shift lever 12 is shifted.

The number of detection elements 41 in each stage may be three or more as long as the detection results (ON/OFF) change in at least three detection elements 41 whenever the shift lever 12 is shifted by one operation position, and the at least three detection elements 41 includes at least one detection element 41 in an upstream side stage that detects the magnet 30 before the operation position of the shift lever 12 is shifted and at least one detection element 41 in a downstream side stage that detects the magnet 30 after the operation position of the shift lever 12 is shifted.

The element array 40 may include, for example, three stages, and the number of the detection elements 41 in the three stages may be 1, 2, and 2. Like the above embodiment, in this case, whenever the shift lever 12 is shifted by one operation position, the magnet 30 is moved relative to the element array 40 by one stage, and the detection elements 41 in two adjacent stages all simultaneously detect the magnet 30. Further, whenever the shift lever 12 is shifted by one operation position, the detection results (ON/OFF) change in at least three detection elements 41. The at least three detection elements 41 includes at least one detection element 41 in an upstream side stage that detects the magnet 30 before the operation position of the shift lever 12 is shifted and at least one detection element 41 in a downstream side stage that detects the magnet 30 after the operation position of the shift lever 12 is shifted. Such detection logic allows for the detection of operation positions, the number of which is "number of stages−1". Accordingly, to detect two or more operation positions, the element array 40 includes at least three stages.

Generally, in the detection logic of the above embodiment, the number of detection elements 41 in the plurality of stages is expressed by the numerical sequence of " . . . 1, 1, 2, 2, 1, 1, 2, 2, 1, 1, 2, 2, . . . " The number of operation positions that may be determined in accordance with the numerical sequence is expressed by "number of stages−1". For example, when employing a position sensor that is in accordance with this detection logic in a gearshift device having five selectable operation positions, patterns such as "1, 1, 2, 2, 1, and 1", "1, 2, 2, 1, 1, and 2", and "2, 2, 1, 1, 2, and 2" may be employed. In this case, as easily understood, the pattern used in the above embodiment, which is "1, 1, 2, 2, 1, and 1", uses the least number of detection elements 41.

In the above embodiment, the magnet 30 is set as the movable element, and the detection elements 41 (element array 40) are set as the fixed elements. Instead, the magnet 30 may be set as a fixed element, and the detection elements 41 (element array 40) may be set as movable elements. In this manner, as long as the magnet 30 is moved relative to the element array 40 whenever the shift lever 12 is shifted by one operation position, any one of the magnet 30 and the element array 40 may be set to be movable.

A power supply may be provided for each detection element 41. In this case, in the same manner as the above embodiment, when grouping the detection elements 41 in accordance with the corresponding power supply, the detection elements in two adjacent stages are divided into two groups using different power supplies. One of the two adjacent stages includes a detection element 41 of a first group, and the other one of the two adjacent stages includes a detection element 41 of a second group. Accordingly, failsafe may be realized even when a failure occurs in a single power supply.

Referring to FIG. 7, when the number of power supplies is the minimum number of two, the third detection element 41 may be changed from the second group (2G) to the first group (1G), and the fourth detection element 41 may be changed from the first group (1G) to the second group (2G).

Application of the position sensor S is not limited to the gearshift device that shifts operation positions between the P position, the R position, the N position, the D position, and the S position. For example, the position sensor S may be applied to a gearshift device that shifts operation positions between the P position, the R position, the N position, and the D position.

The position sensor S of the above embodiment is applied to a stationary type gearshift device 1 that holds an operation position until the shift lever 12 is operated again. Instead, the position sensor S may be applied to a momentary type gearshift device that automatically returns an operation member to a home (H) position, which is a basic position, when the operation member is released.

An optical position sensor, which includes a light source and optical sensors, may be used. The light source may be used as the detected subject, and the optical sensors may be used as the detection elements.

Figure 14:
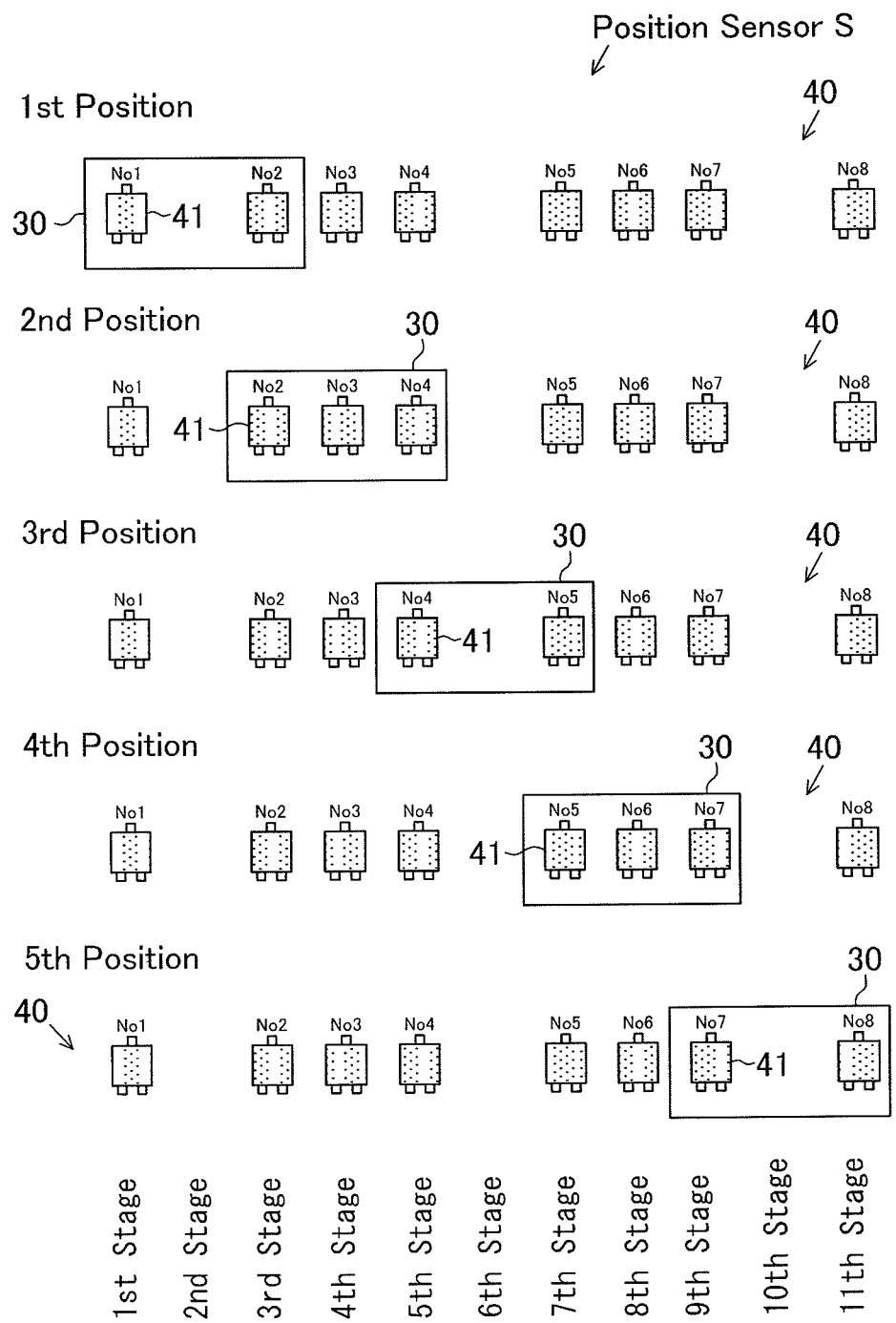
FIG. 14 is a schematic plan view illustrating a further example of a position sensor.

FIG. 14 illustrates a position sensor S of another example. The position sensor S includes a magnet 30 and an element array 40 having eleven stages and arranged facing the magnet 30. Although not particularly limited, the magnet 30 has, for example, the form of a block. Each stage of the element array 40 includes a single detection element 41 or includes no detection elements 41. In this example, the first stage, the third to fifth stages, the seventh to ninth stages, and the eleventh stage each includes a detection element 41, and the remaining elements do not include a detection element 41. Hereinafter, the detection element 41 of the first stage will be referred to as the first detection element 41 (No. 1). The detection element 41 of the third stage will be referred to as the second detection element 41 (No. 2). The detection element 41 of the fourth stage will be referred to as the third detection element 41 (No. 3). The detection element 41 of the fifth stage will be referred to as the fourth detection element 41 (No. 4). The detection element 41 of the seventh stage will be referred to as the fifth detection element 41 (No. 5). The detection element 41 of the eighth stage will be referred to as the sixth detection element 41 (No. 6). The detection element 41 of the ninth stage will be referred to as the seventh detection element 41 (No. 7). The detection element 41 of the eleventh stage will be referred to as the eighth detection element 41 (No. 8).

The magnet 30 has a size allowing for simultaneous detection by each of the detection elements 41 in three consecutive stages. For example, when the shift lever 12 (operation member) is located at a first position, the magnet 30 is simultaneously detected by all of the detection elements 41 in the first to third stages, that is, the first and second detection elements 41. When the shift lever 12 is located at a second position, the magnet 30 is simultaneously detected by all of the detection elements 41 in the third to fifth stages, that is, the second to fourth detection elements 41. When the shift lever 12 is located at a third position, the magnet 30 is simultaneously detected by all of the detection elements 41 in the fifth to seventh stages, that is, the fourth and fifth detection elements 41. When the shift lever 12 is located at a fourth position, the magnet 30 is simultaneously detected by all of the detection elements 41 in the seventh to ninth stages, that is, the fifth to seventh detection elements 41. When the shift lever 12 is located at a fifth position, the magnet 30 is simultaneously detected by all of the detection elements 41 in the ninth to eleventh stages, that is, the seventh and eighth detection elements 41.

In this manner, the magnet 30 is moved relative to the element array 40 by two stages whenever the shift lever 12 is shifted by one operation position.

Referring to FIG. 15, when the shift lever 12 is shifted from the first position to the second position, the detection result of the first detection element 41 is switched from ON to OFF. Further, the detection results of the third and fourth detection elements 41 are switched from OFF to ON.

Referring to FIG. 6, when the shift lever 12 is shifted from the second position to the third position, the detection results of the second and third detection elements 41 are switched from ON to OFF. Further, the detection result of the fifth detection element 41 is switched from OFF to ON.

Figure 17:
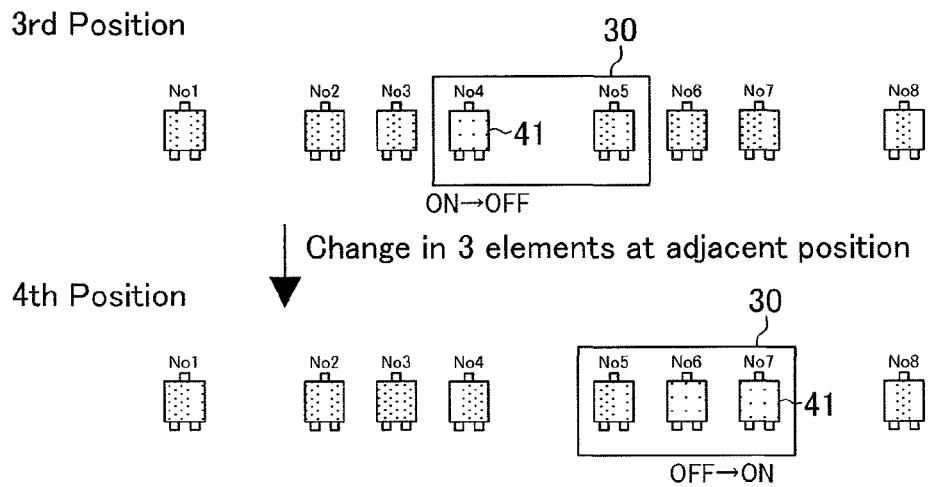
FIG. 17 is a schematic plan view illustrating movement of the shift lever from the third position to the fourth position.

Referring to FIG. 17, when the shift lever 12 is shifted from the third position to the fourth position, the detection result of the fourth detection element 41 is switched from ON to OFF. Further, the detection results of the sixth and seventh detection elements 41 are switched from OFF to ON.

Figure 18:
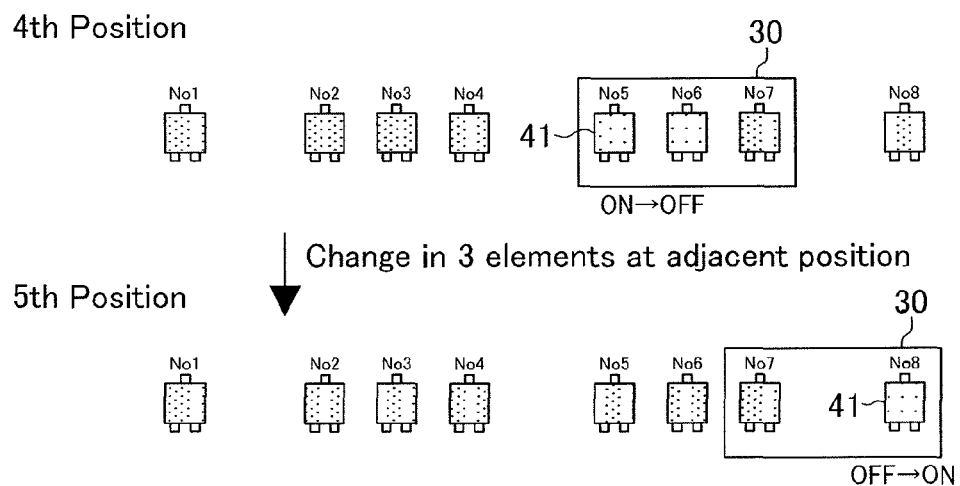
FIG. 18 is a schematic plan view illustrating movement of the shift lever from the fourth position to the fifth position.

Referring to FIG. 18, when the shift lever 12 is shifted from the fourth position to the fifth position, the detection results of the fifth and sixth detection elements 41 are switched from ON to OFF. Further, the detection result of the eighth detection element 41 is switched from OFF to ON.

In this manner, the element array 40 includes at least three (three in the present example) detection elements 41 of which detection results (ON/OFF) change whenever the shift lever 12 is shifted by one operation position. The at least three detection elements 41 includes at least one detection element 41 in an upstream side stage or middle stage that detects the magnet 30 before the operation position of the shift lever 12 is shifted and at least one detection element 41 in a middle stage or downstream side stage that detects the magnet 30 after the operation position of the shift lever 12 is shifted.

Figure 19:
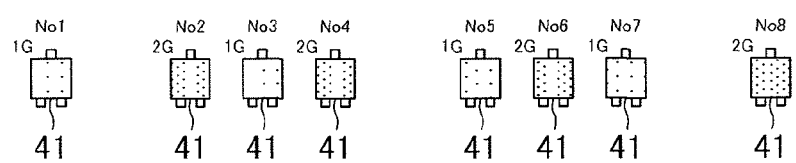
FIG. 19 is a schematic plan view illustrating the power supply grouping of detection elements.

Referring to FIG. 19, in the element array 40 of FIG. 14, the first, third, fifth, and seventh detection elements 41 belong to a first group (1G) that uses the first power supply 51 to function. The second, fourth, sixth, and eighth detection elements 41 belong to a second group (2G) that uses the second power supply 52 to function. When grouping the detection elements 41 in accordance with the corresponding power supply, the detection elements 41 of three consecutive stages may be divided into two groups that use different power supplies. In this case, two adjacent ones of three consecutive stages at each operation position includes a detection element 41 belonging to the first group, and the remaining one of the three consecutive stages includes a detection element 41 belonging to the second group.

In the position sensor S using the element array 40 of FIG. 14, in the same manner as the above embodiment, the SBW ECU 60 (FIG. 7) determines an operation position based on the detection signals of the eight detection elements 41 in the element array 40, that is, the combination of ON signals indicating the presence of the magnet 30 and the OFF signals indicating the absence of the magnet 30. Then, the ECU 60 shifts the mode of the transmission in accordance with the determined operation position.

This structure also obtains advantages (1) to (4) of the above embodiment. The magnet 30 only needs to have a size allowing for simultaneous detection by each detection element 41 in three consecutive stages. For example, the magnet 30 may have a circular or ellipsoidal shape.

The layout of the element array 40, the power supply grouping of the detection elements 41, and the like in the example of FIG. 14 may be varied within the scope of the claims.

Generally, in the detection logic of the example illustrated in FIG. 14, the number of detection elements 41 in the plurality of stages is expressed by the numerical sequence of " . . . 1, 1, 1, 0, 1, 1, 1, 0, 1, 1, 1, 0, 1, 1, 1, 0, . . . " The number of operation positions that may be determined in accordance with the numerical sequence is expressed by "(number of stages−1)/2". For example, when employing a position sensor that is in accordance with this detection logic in a gearshift device having five selectable operation positions, a pattern of eleven stages beginning with "1, 0, 1, 1, 1, 0, . . . " or a pattern of eleven stages beginning with "1, 1, 1, 0, 1, 1, 1, . . . " may be employed. For example, a pattern beginning with "1, 1, 0, . . . " is not employed because the number of elements that changes is four, two, or etc., and thus not constant. That is, a pattern beginning with "1, 1, 0, . . . " has four or two elements that change, and thus does not satisfy the requirement of "at least three" in the claims.

The present examples and embodiments are to be considered as illustrative and not restrictive, and the invention is not to be limited to the details given herein, but may be modified within the scope and equivalence of the appended claims.

The invention claimed is:

1. A position sensor that detects operation positions of an operation member, the position sensor comprising:
   an element array including at least three stages arranged in columns, wherein each of the at least three stages, corresponding to one of the columns, include one or more detection elements, and the detection elements of the element array are all the same type of detection elements;

a single movable element that is movable in cooperation with a movement of the operation member, wherein the operation member is movable along a shift gate from an upstream side to a downstream side and from the downstream side to the upstream side, and the movable element is configured to be simultaneously detected, for each of the operation positions, by each of the detection elements included in only two adjacent stages of the element array, wherein the two adjacent stages are defined by a selected one of the operation positions and varies based upon the operation position that is selected, wherein a first one of the two adjacent stages that is closest to the upstream side defines an upstream side first stage and a second one of the two adjacent stages that is closest to the downstream side defines a downstream side second stage, thereby defining the selected one of the operation positions, wherein whenever the operation member is shifted by one operation position toward the downstream side:

the movable element is moved relative to the element array toward the downstream side in a moving direction of the operation member by one stage, wherein the movable element has a size such that the movable element selectively faces only some of the detection elements of the element array in each of the operation positions, each of the detection elements of the element array outputs a detection result indicating an ON detection result when detecting the movable element and an OFF detection result when the movable element is not detected, the element array is arranged such that the detection result of at least three of the detection elements of the element array change whenever the operation member is shifted by one operation position, and the at least three detection elements of which the detection results change whenever the operation member is shifted by one operation position toward the downstream side include:

at least one detection element in the upstream side first stage of the two adjacent stages that detects the movable element at the selected one of the operation positions before the operation member is shifted by one operation position and at least one detection element in the downstream side second stage of the two adjacent stages that detects the movable element after the operation member is shifted by one operation position.

2. The position sensor according to claim 1, wherein the detection elements belonging to the two adjacent stages of the element array are divided into two groups using different power supplies, one of the two adjacent stages includes a detection element belonging to a first group, and the other one of the two adjacent stages includes a detection element belonging to a second group.

3. A gearshift device comprising:
an operation member; and
the position sensor according to claim 1 that detects operation positions of the operation member.

4. A position sensor that detects operation positions of an operation member, the position sensor comprising:

an element array including at least five stages arranged in columns, wherein each of the at least five stages, corresponding to one of the columns, includes either one detection element or includes no detection elements, and the detection elements of the element array are all the same type of detection elements;

a single movable element that is movable in cooperation with a movement of the operation member, wherein the operation member is movable along a shift gate from an upstream side to a downstream side and from the downstream side to the upstream side, and the movable element is configured to be simultaneously detected, for each of the operation positions, by each of two or three detection elements included in three consecutive stages of the element array, wherein the three consecutive stages are defined by a selected one of the operation positions and varies based upon the operation position that is selected, wherein a first one of the three consecutive stages that is closest to the upstream side defines an upstream side first stage, wherein a second one of the three consecutive stages that is closer to the downstream side than the upstream side first stage defines a middle second stage, and wherein a third one of the three consecutive stages that is closer to the downstream side than both the upstream side first stage and the middle second stage defines a downstream side stage, thereby defining the selected one of the operation positions, wherein whenever the operation member is shifted by one operation position toward the downstream side:

the movable element is moved relative to the element array toward the downstream side in a moving direction of the operation member by two stages, wherein the movable element has a size such that the movable element selectively faces only some of the detection elements of the element array in each of the operation positions, each of the detection elements of the element array outputs a detection result indicating an ON detection result when detecting the movable element and an OFF detection result when the movable element is not detected, the element array is arranged such that the detection results of at least three of the detection elements of the element array change whenever the operation member is shifted by one operation position, and the at least three detection elements of which the detection results change whenever the operation member is shifted by one operation position toward the downstream side include:

the detection element in the upstream side first stage of the three consecutive stages that detects the movable element at the selected one of the operation positions before the operation member is shifted by one operation position, the detection element that is provided in the middle second stage of the three consecutive stages either before or after the operation member is shifted by one operation position, and the detection element in the downstream side third stage of the three consecutive stages that detects the movable element after the operation member is shifted by one operation position.

5. The position sensor according to claim 4, wherein
the detection elements belonging to the three consecutive
stages of the element array are divided into two groups
using different power supplies,
two adjacent ones of the three consecutive stages at each
operation position includes a detection element belonging to a first group, and
the remaining one of the three consecutive stages at each
operation position includes a detection element belonging to a second group.

6. A gearshift device comprising:
an operation member; and
the position sensor according to claim 4 that detects
operation positions of the operation member.

* * * * *